United States Patent
Kim et al.

(12) 
(10) Patent No.: US 6,664,579 B2
(45) Date of Patent: Dec. 16, 2003

(54) MAGNETIC RANDOM ACCESS MEMORY USING BIPOLAR JUNCTION TRANSISTOR

(75) Inventors: Chang Shuk Kim, Kyoungki-do (KR); Hee Bok Kang, Daejeon Metropolitan (KR); Sun Ghil Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/139,890

(22) Filed: May 6, 2002

(65) Prior Publication Data

US 2002/0175357 A1 Nov. 28, 2002

(30) Foreign Application Priority Data

May 22, 2001 (KR) .......................................... 2001-28133

(51) Int. Cl.[7] .............................................. H01L 29/76

(52) U.S. Cl. ................. 257/296; 257/3; 257/9; 257/285; 257/300; 365/171; 365/173; 365/66

(58) Field of Search ............................. 365/171, 173, 365/66; 257/3, 9, 285, 300

(56) References Cited

U.S. PATENT DOCUMENTS 6,351,410 B1 * 2/2002 Nakao et al. ............... 365/171

* cited by examiner

*Primary Examiner*—David Nelms
*Assistant Examiner*—Mai-Huong Tran
(74) *Attorney, Agent, or Firm*—Marshall, Gerstein & Borun LLP

(57) ABSTRACT

A magnetic random access memory (MRAM) having an MTJ cell located between a word line and a gate oxide film, a reference voltage line in a source junction region, and a connection line in a drain junction region. The constitution and fabrication process of the MRAM are simplified to improve productivity and properties of the device.

8 Claims, 3 Drawing Sheets

MAGNETIC RANDOM ACCESS MEMORY USING BIPOLAR JUNCTION TRANSISTOR

BACKGROUND

1. Technical Field

A magnetic random access memory and a method for fabricating the same are disclosed, and in particular technologies for fabricating a magnetic random access memory (abbreviated as 'MRAM') that has higher speeds than static random access memory (SRAM), integration as high as dynamic random access memory (DRAM), and properties of a nonvolatile memory such as a flash memory are disclosed.

2. Description of the Background Art

Many semiconductor memory manufacturing companies have been developing MRAM's using a ferromagnetic material as one of the next generation of memory devices. The MRAM, in particular, is a memory device for reading and writing information by forming multi-layer ferromagnetic thin films, and sensing current variations according to a magnetization direction of the respective thin films. The MRAM has high speed, low power consumption and high integration density due to the special properties of the magnetic thin film, and performs a nonvolatile memory operation such as a flash memory.

In its function as a memory device, the MRAM utilizes a giant magneto resistive (abbreviated as 'GMR') phenomenon or a spin-polarized magneto-transmission (SPMT) generated when the spin influences electron transmission.

MRAM's using GMR utilize a phenomenon in which resistance is remarkably varied when spin directions are different in two magnetic layers having a non-magnetic layer disposed between the two magnetic layers.

MRAM's using SPMT utilize a phenomenon in which larger current transmission is generated when spin directions are identical in two magnetic layers having an insulating layer disposed therebetween.

MRAM research, however, is still in the early stages, and is concentrated mostly on the formation of multi-layer magnetic thin films and less on the research of unit cell structure and peripheral sensing circuits.

FIG. 1 is a cross-sectional diagram illustrating a conventional MRAM. As shown, a gate electrode 33, namely a first word line, is formed on a semiconductor substrate 31. Here, a gate oxide film 32 is formed on an interface between the gate electrode 33 and the semiconductor substrate 31.

Source/drain junction regions 35a and 35b are formed in the semiconductor substrate 31 on both sides of the first word line 33, and a reference voltage line 37a and a first conductive layer 37b are formed to contact the source/drain junction regions 35a and 35b. Here, the reference voltage line 37a is formed in the formation process of the first conductive layer 37b.

Thereafter, a first interlayer insulating film 39 is formed to planarize the whole surface of the resultant structure, and a first contact plug 41 is formed to contact the first conductive layer 37b.

A second conductive layer which is a lower read layer 43 contacting the first contact plug 41 is patterned.

A second interlayer insulating film 45 is formed to planarize the whole surface of the resultant structure, and a second word line 47, which is a write line, is formed on the second interlayer insulating film 45.

A third interlayer insulating film 48 is formed to planarize the upper portion of the second word line 47, which is the write line. A second contact plug 49 is then formed to expose the second conductive layer 43.

A seed layer 51 is formed to contact the second contact plug 49. Here, the seed layer 51 is formed to overlap between the upper portion of the second contact plug 49 and the upper portion of the write line 47. An additional interlayer insulating film 53 is also formed.

Thereafter, a semi-ferromagnetic layer (not shown), a pinned ferromagnetic layer 55, a tunnel barrier layer 57 and a free ferromagnetic layer 59 are stacked on the seed layer 51, thereby forming a magnetic tunnel junction (MTJ) cell 100 to have a pattern size as large as the write line 47 and to overlap the write line 47.

At this time, the semi-ferromagnetic layer prevents the magnetization direction of the pinned layer 55 from being changed, with the magnetization direction of the pinned ferromagnetic layer 55 fixed to one direction. The magnetization direction of the free ferromagnetic layer 59 can be changed by a generated magnetic field, and information of '0' or '1' can be stored according to the magnetization direction of the free ferromagnetic layer 59.

A fourth interlayer insulating film 60 is formed over the resultant structure, and evenly etched to expose the free ferromagnetic layer 59. An upper read layer, namely a bit line 61 is formed to contact the free ferromagnetic layer 59.

Still referring to FIG. 1, the structure and operation of the MRAM will now be explained. The unit cell of the MRAM includes one field effect transistor having the first word line 33 as a read line for reading information, the MTJ cell 100, the second word line 47, which is a write line determining the magnetization direction of the MTJ cell 100 by forming an external magnetic field by applying current, and the bit line 61 which is an upper read layer informing the magnetization direction of the free layer by applying current to the MTJ cell 100 in a vertical direction.

Here, during the operation of reading the information from the MTJ cell 100, a voltage is applied to the first word line 33 as the read line, thereby turning the field effect transistor on, and the magnetization direction of the free ferromagnetic layer 59 in the MTJ cell 100 is detected by sensing a magnitude of current applied to the bit line 61.

During the operation of storing the information in the MTJ cell 100, while maintaining the field effect transistor in off state, the magnetization direction in the free ferromagnetic layer 59 is controlled by a magnetic field generated by applying current to the second word line 47, which is the write line, and the bit line 61. At this time, when current is applied to the bit line 61 and the write line 47 at the same time, one cell can be selected in a vertical intersecting point of the two metal lines.

Further, the operation of the MTJ cell 100 in the MRAM will be described as follows. When the current flows in the MTJ cell 100 in a vertical direction, a tunneling current flows through an insulating film 60. This tunneling current increases when the tunnel barrier layer 57 and the free ferromagnetic layer 59 have the same magnetization direction. When the tunnel barrier layer 57 and the free ferromagnetic layer 59 have different magnetization directions, the tunneling current decreases due to a tunneling magneto resistance (TMR) effect. A decrease in the magnitude of the current due to the TMR effect is sensed, and thus the magnetization direction of the free ferromagnetic layer 59 is sensed, thereby detecting the information stored in the cell.

FIG. 2 is a cross-sectional diagram illustrating a second example of a conventional MRAM. In the example shown in FIG. 2, an element isolating film (not shown) defining an active region is formed on a semiconductor substrate 111. A gate electrode 113 having a gate oxide film 112 is formed on the active region of the semiconductor substrate 111, an insulating film spacer (not shown) is formed at the side walls thereof, and source/drain regions 115a and 115b are formed by implanting an impurity to the active region of the semiconductor substrate 111, thereby forming a transistor. The gate oxide film 112 is positioned on an interface between the gate electrode 113 and the semiconductor substrate 111.

The effect of magnetic field is increased as the distance between the MTJ cell of the MRAM and the gate electrode 113 used as the write line becomes shorter. Accordingly, an interlayer insulating film is formed in a succeeding process in a reduced thickness.

The gate electrode 113 has a stacked structure of a polysilicon film/metal film, a polysilicon film/metal film/polysilicon film, a polysilicon film/silicide ($CoSi_x$, $TiSi_x$, etc.) film, or a polysilicon film/silicide ($CoSi_x$, $TiSi_x$, etc.) film/polysilicon film in order to smoothly form an insulating material thereon.

Thereafter, a first interlayer insulating film 121 is formed to planarize the whole surface of the resultant structure. Here, a reference voltage line 117 contacting the source junction region 115a and a lower read layer 119 contacting the drain junction region 115b are provided.

A second interlayer insulating film 123 is formed on the first interlayer insulating film 121, and a contact plug 125 is formed to contact the lower read layer 119 through the second interlayer insulating film 123. A seed layer 127 is formed to contact the contact plug 125, namely the lower read layer 19. Here, the seed layer 127 is formed to sufficiently overlap with the first word line 113. A third interlayer insulating film 129 is then formed to expose the seed layer 127. Next, an MJT cell 137 is formed at the upper portion of the seed layer 127 over the first word line 113.

The MJT cell 137 comprises a stacked structure of a semi-ferromagnetic layer (not shown), a pinned ferromagnetic layer 131, a tunnel barrier layer 133 and a free ferromagnetic layer 135. The MJT cell 137 is formed to contact the seed layer 127 and is patterned by using an MTJ cell mask, thereby forming the MTJ cell 137.

Thereafter, a fourth interlayer insulating film 139 is formed in a flat type to expose the MTJ cell 137, and a bit line contacting the free ferromagnetic layer 135 of the MTJ cell 137, namely an upper read layer 141, is formed, thereby finishing formation of the MRAM cell.

The data write operation of the second example of a MRAM will now be described.

Firstly, the magnetization direction of the free ferromagnetic layer 135 is changed by using a magnetic field generated by applying current to the gate electrode, which is the first word line 113, and the bit line 141. Here, the first word line 113 has a high level, and thus the current flowing through the MTJ cell 137 is discharged to the reference voltage line 117 through the transistor. In order to prevent the foregoing problem, a reference voltage potential is increased by applying a reference voltage to the reference voltage line 117, so that the current flowing through the MTJ cell 137 is not discharged to the reference voltage line 117 through the transistor.

At this time, it is possible to simultaneously apply the Vss reference voltage to the reference voltage line 117 and the Vbs substrate voltage to the semiconductor substrate 111. In addition, the substrate voltage can be applied to the reference voltage line 117, instead of the ground voltage.

As described above, in the conventional MRAM and the method for fabricating the same, since the contact to the bit line is formed through the MTJ cell, the process is complicated, productivity is reduced due to an increased cell area and, thus, high integration of the semiconductor device is difficult to achieve.

SUMMARY OF THE DISCLOSURE

Accordingly, the present disclosure teaches a magnetic random access memory (MRAM) and a method for fabricating the same that improves productivity and properties of MRAM by simplifying a structure and fabrication process to easily perform a contact process of a bit line by disposing a resistance device such as MTJ cell between a gate oxide film and a word line.

A MRAM constructed in accordance with the teachings of the present invention includes a semiconductor substrate; source/drain junction regions provided at an active region of the semiconductor substrate; a stacked structure of a gate oxide film, an MTJ cell of an island type and a word line positioned over a channel region between the source/drain junction regions, either overlying the channel region and a portion of the S/D region or only the channel region; a reference voltage line contacting the source junction region; and a bit line contacting the drain junction region.

A method for fabricating an MRAM in accordance with the teachings of the present invention includes the steps of: forming source/drain junction regions at an active region of a semiconductor substrate; forming source/drain junction regions at an active region of a semiconductor substrate; forming a stacked structure of an oxide film for a gate, a pinned ferromagnetic layer, a tunnel barrier layer and a free ferromagnetic layer over the resultant structure; forming an island-type MTJ cell by patterning the stacked structure of the pinned ferromagnetic layer, the tunnel barrier layer and the free ferromagnetic layer according to a photolithography process using an MTJ cell mask; forming a conductive layer for a word line over the resultant structure; forming a stacked structure of a gate oxide film, the MTJ cell and the word line by patterning the conductive layer for the word line and the oxide film for the gate according to a photolithography process using a word line mask; forming a first planarized interlayer insulating film over the resultant structure to expose the upper portion of the word line; forming a reference voltage line and a connection line contacting the source/drain junction regions respectively through the first interlayer insulating film; forming a second interlayer insulating film over the resultant structure; and forming a bit line to contact the connection line through the second interlayer insulating film.

In the above-described apparatus and method, a resistance device, such as an MTJ cell, is inserted between the word line and the gate oxide film, and the reference voltage line and the bit line are formed to respectively contact the source/drain junction regions.

In the data write process, necessary current is simultaneously applied to the word line and the bit line to generate a magnetic field. The magnetic field generates magnetization inversion in the free ferromagnetic layer of the MTJ cell to write data.

In the data read process, when a voltage is applied to the word line instead of a current, a resistance of the MTJ cell is varied according to information stored in the MTJ cell and, thus, the gate oxide film having a constant resistance value and the whole resistance of the MTJ cell are varied according to the information stored in the MTJ cell. In addition, a controllable current is generated to flow through the MTJ cell and the gate oxide film, and a voltage is applied to the gate oxide film at the same time, thereby forming a channel. Accordingly, a threshold voltage value of a MOS transistor is changed by variations of the resistance value of the MTJ cell, and sensed through the bit line, to read data.

Preferably, the gate oxide film is a thin film having a thickness below 30 Å for easy current tunneling.

DETAILED DESCRIPTION OF THE PREFERRED EMBODIMENTS

Figure 1:
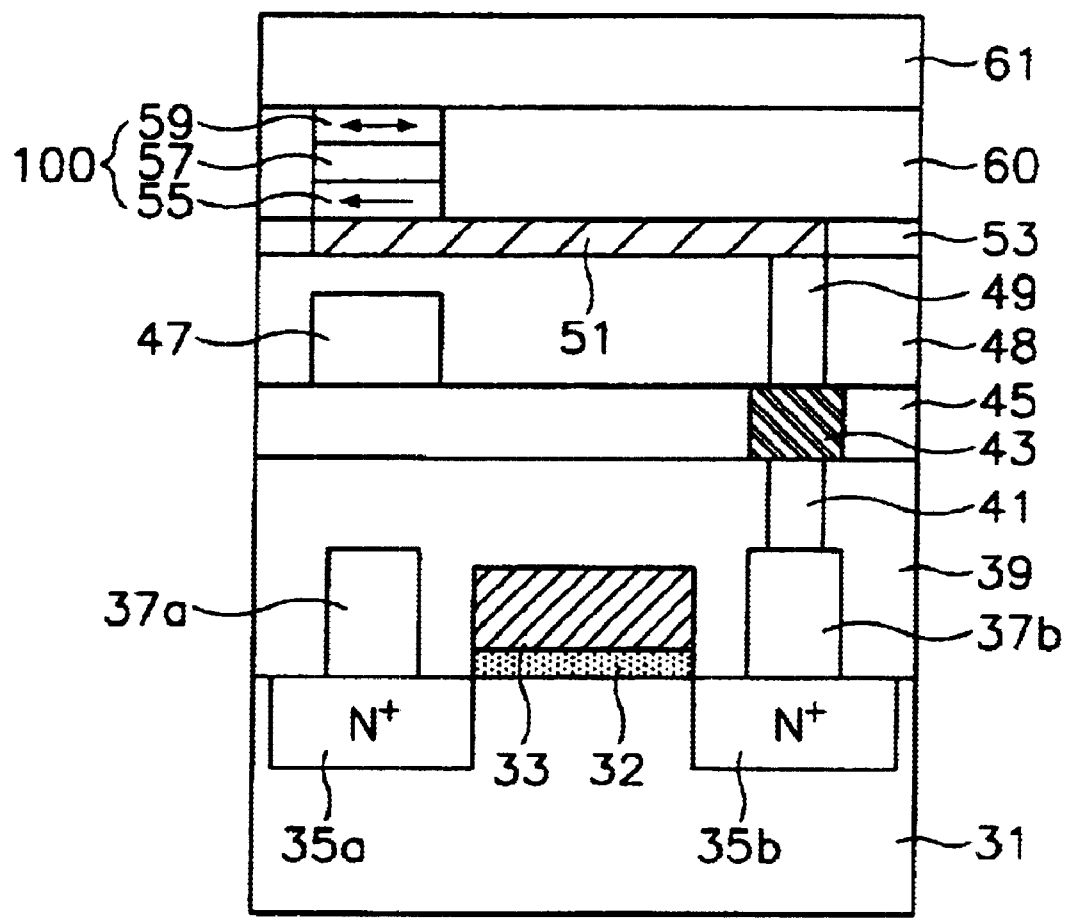
FIG. 1 is a cross-sectional diagram illustrating a first example of a conventional MRAM.
Figure 2:
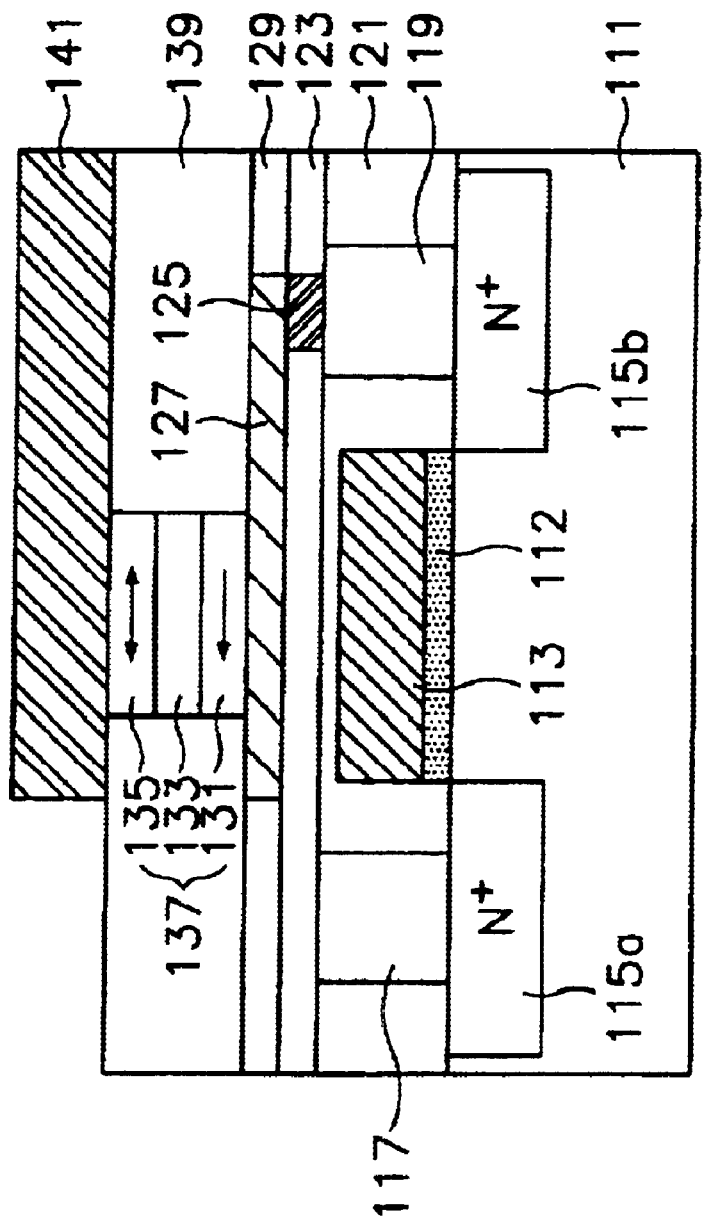
FIG. 2 is a cross-sectional diagram illustrating a second example of a conventional MRAM.
Figure 3:
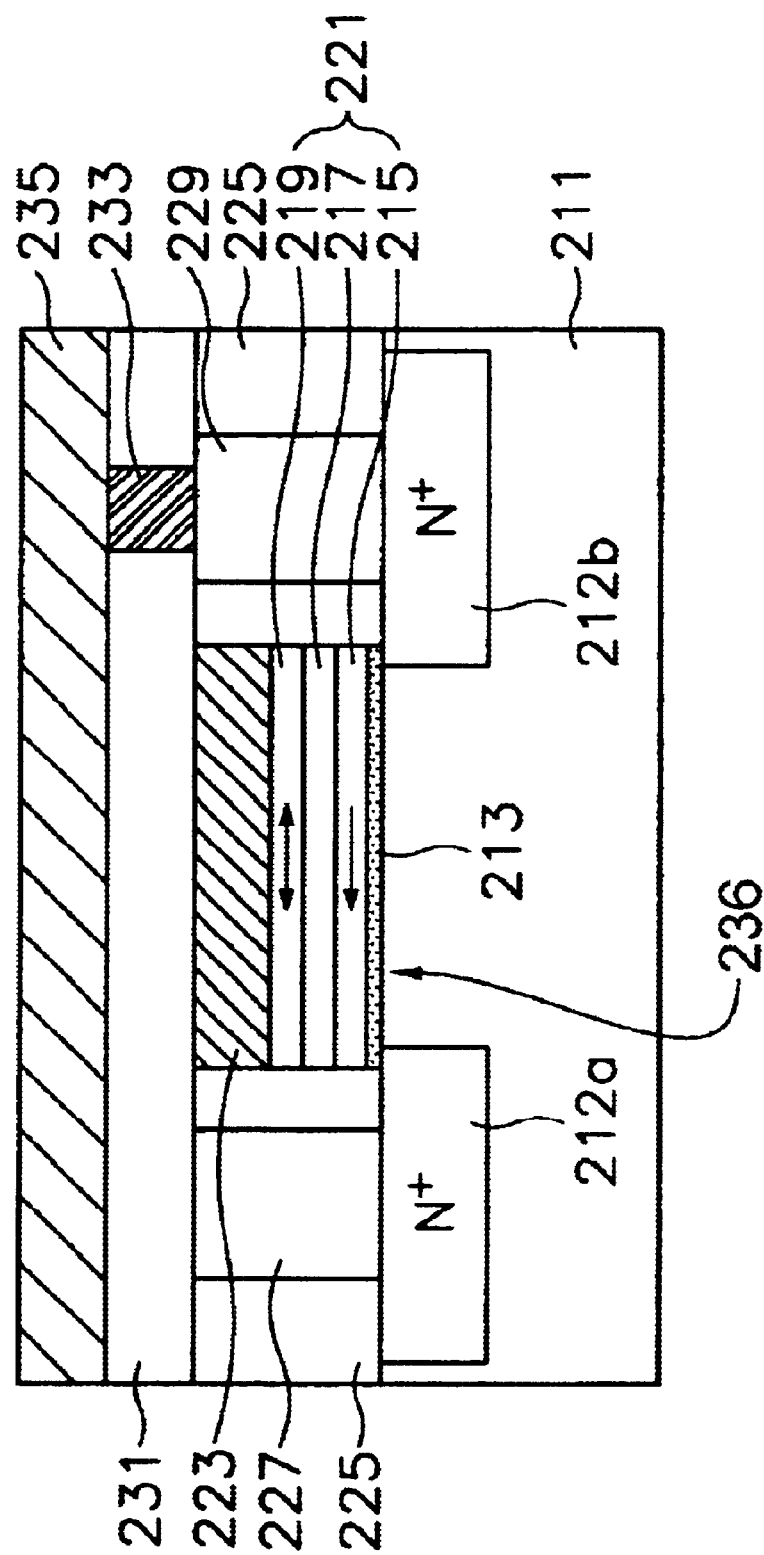
FIG. 3 is a cross-sectional diagram illustrating an MRAM constructed in accordance with the teachings of the present invention.

A disclosed magnetic random access memory (MRAM) and a disclosed method for fabricating the same will now be described in detail with reference to FIG. 3. FIG. 3 is a cross-sectional diagram illustrating the MRAM and the method for fabricating the same.

As depicted in FIG. 3, the disclosed MRAM includes a semiconductor substrate 211 and source/drain junction regions 212a and 212b provided at an active region of the semiconductor substrate 211. The source/drain junction regions 212a and 212b are formed by implanting an impurity to a predetermined region according to an implant process using a mask.

Further included are a stacked structure of a gate oxide film 213, an MTJ cell 221 and a word line 223 positioned at the upper portion of a channel region 236 extending to the source/drain junction regions 212a and 212b. The gate oxide film 213 is formed at a thickness below 30 Å in order to have a low resistance value that enables generation of a controllable current flowing through the gate oxide film 213 itself. The MTJ cell 221 comprises a stacked structure of a pinned ferromagnetic layer 215, a tunnel barrier layer 217 and a free ferromagnetic layer 219. At least three multiple data recording states including '0' or '1' can be obtained in one cell of the memory device, by setting up a magnetization direction of the free ferromagnetic layer 219 to have an identical or opposite magnetization direction to that of the pinned ferromagnetic layer 215 or to have a predetermined angle. The bit line 235 is connected to the drain junction region 212b through a connection line 229 and a contact plug 233.

A reference voltage line 227 contacts the source junction region 212a and a bit line 235 contacts the drain junction region 212b.

The method for fabricating the MRAM will now be described with reference to FIG. 3.

A mask layer (not shown) is formed to expose a predetermined portion where the source/drain junction regions are to be formed in the active region of the semiconductor substrate 211. The source/drain junction regions 212a and 212b are formed by implanting impurities to the semiconductor substrate 211, and then the mask layer is removed. As shown in FIG. 3, P+, N+ and N+ ions are implanted to the substrate, source and drain, respectively. Alternatively, N+, P+ and P+ ions can be implanted to the substrate, source and drain, respectively.

Oxide film 213 for a gate is deposited over the semiconductor substrate 211 in the region of the source/drain junction regions 212a and 212b at a thickness of 30 Å or less. A stacked structure of a pinned ferromagnetic layer (not shown), a tunnel barrier layer (not shown) and a free ferromagnetic layer (not shown) is then formed on the oxide film 213 to compose the MTJ cell 221.

Thereafter, the MTJ cell 221 is formed in the shape of an island type is formed comprising a pinned ferromagnetic layer pattern 215, a tunnel barrier layer pattern 217 and a free ferromagnetic layer pattern 219 by patterning the stacked structure according to a photolithography process using an MTJ cell mask (not shown). A conductive layer for a word line is formed over the resultant structure. The oxide film for the gate and the conductive layer for the word line are then patterned according to a photolithography process using a word line mask (not shown), thereby forming the gate oxide film 213 and the word line 223, respectively. Here, the word line 223 further comprises a mask insulating film at its upper portion, which improves insulating property.

Since an edge portion of the gate oxide film 213 partially overlaps with edge portions of the source junction region 212a and the drain junction region 212b, the stacked structure of the gate oxide film 213, the MTJ cell 221 and the word line 223 may cover the whole channel region 236 between the source junction region 212a and the drain junction region 212b. Alternatively, the edge portion of the gate oxide film 213 may not overlap the edge portions of the source junction region 212a and the drain junction region 212b (not shown), such that the stacked structure only partially covers the channel region 236.

An insulating film spacer (not shown) may be formed at side walls of the stacked structure of the gate oxide film 213, the MTJ cell 221 and the word line 223 to improve an insulating property of the device.

Thereafter, a first interlayer insulating film 225, which planarizes the upper portion of the resultant structure, is formed. Here, the first interlayer insulating film 225 is planarized to expose the upper portion of the word line 223. The reference voltage line 227 and the connection line 229 are then formed to contact the source junction region 212a and the drain junction region 212b respectively through the first interlayer insulating film 225.

A second interlayer insulating film 231 is next formed over the resultant structure, and evenly etched to planarize the upper surface thereof. A bit line contact plug 233 is formed to contact the connection line 229 through the second interlayer insulating film 231. Here, the connection line 229 is exposed by etching the second interlayer insulating film 231 according to a photolithography process using a bit line contact mask (not shown). A conductive layer for a bit line contact plug is deposited to contact the connection line 229, and is evenly etched to expose the second interlayer insulating film 231, thereby forming the bit line contact plug 233. Next, the bit line 235 is formed to contact the bit line contact plug 233.

Still referring to FIG. 3, the operation of the MRAM will now be described.

A data write operation is performed by applying current to the word line 223 and the bit line 235 in a state where the MOS transistor is turned off.

When the current is applied to the word line 223, the current does not flow toward the channel of the MOS transistor due to resistance of the tunnel barrier layer 217 formed between the pinned ferromagnetic layer 215 and the free ferromagnetic layer 219 in the MTJ cell 221 and resistance elements of the gate oxide film 213, but flows toward the word line 223. Because the MOS transistor is turned off, the current applied to the bit line 235 only flows through the bit line itself.

Controlling the amount and direction of the current in the word line 223 and the bit line 235 crossing each other in a vertical direction or at a predetermined angle allows setting the magnetization direction of the free ferromagnetic layer 219 in the MTJ cell in a desired direction, and to execute the data write operation. After the data write operation, the magnetization direction of the free ferromagnetic layer 219 of the MTJ cell is set to be identical or opposite to the magnetization direction of the pinned ferromagnetic layer 215, or to have a predetermined angle. The MTJ resistance is varied according to the angle of the free ferromagnetic layer 219 and the pinned ferromagnetic layer 215, which is used to perform the data write operation.

During the data read operation, a voltage is applied to the word line to turn the MOS transistor on. At this time, the current is not applied. The voltage applied to the word line senses the total value of the resistances, in series, of the MTJ cell 221 having a resistance value varied according to the magnetization direction of the free ferromagnetic layer 219 in the MTJ cell set by the write operation, and the gate oxide film 213 having a limited resistance value. Here, the gate oxide film 213 is formed at a thickness below 30 Å in order to have a resistance value lower than the general gate oxide film in conventional DRAM MOS transistors. This allows generation of controllable current larger than the leakage current flowing through the MTJ cell 221 and the gate oxide film 213.

When the current generated through the MTJ cell 221 and the gate oxide film 213 flows through the MTJ cell 221, while the current is discharged through the gate oxide film 213, a voltage drop appears due to the resistance of the MTJ cell 221. Thus, the voltage applied to the gate oxide film 213 is varied according to the resistance value of the MTJ cell 221.

Since the voltage applied to the gate oxide film 213 is varied according to the resistance value of the MTJ cell 221, a threshold voltage of the MOS transistor is changed when it is turned on. The bit line connected to the MOS transistor senses the threshold voltage, to read the stored information.

In another aspect of the disclosed device, the MTJ cell 221 is not directly inserted into the transistor, but electrically connected thereto.

It is noted that any kind of magneto-resistance devices having a resistance value varied due to magnetization or magnetism may be used in place of the MTJ cell 221. Examples include AMRC, GMRC, spin valve, ferromagnetic substance/metal semiconductor hybrid structures, III–V group magnetic semiconductor composite structures, metal(semi-metal)/semiconductor composite structures, and colossal magneto-resistance (CMR). Alternatively, a phase transformation device having a resistance value varied according to material phase transformation due to an electric signal may also be employed.

As another alternative, the reference voltage line 227 may be formed as shown in FIG. 3, or formed at the lower portion of the transistor.

The disclosed MRAM can be applied to a magnetic field sensing device such as a magnetic hard disk head and a magnetic sensor. Moreover, the disclosed MRAM can be applied to a vertical bipolar junction transistor regardless of the structure of the transistor. The insulating film spacer can be formed at side walls of the gate oxide film, the MTJ cell and the word line to improve the insulating property.

As discussed earlier, the disclosed MRAM includes a variable resistance device, such as a MTJ cell, inserted between the word line, which is used as the write line, and the gate oxide film. As a result, the whole fabrication process of the MRAM is simplified to improve productivity and reliability of the device.

While the teachings of this disclosure have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A magnetic random access memory (MRAM) comprising:
    a word line;
    a gate oxide film; and
    a variable resistance device disposed between the word line and the gate oxide film and engaging both the word line and the gate oxide film.

2. The MRAM according to claim 1, wherein the variable resistance device comprises a magneto-resistance device selected from the group consisting of an MTJ cell, an AMR, a GMR, a spin valve and a CMR.

3. The MRAM according to claim 1, wherein the variable resistance device comprises a phase transformation resistance device having a resistance value varied by phase transformation due to an electric signal.

4. A magnetic random access memory (MRAM) comprising:
    a semiconductor substrate;
    source/drain junction (S/D) regions disposed in an active region of the semiconductor substrate with a channel region disposed on top of the substrate between the S/D regions;
    a stacked structure comprising a gate oxide film, an MTJ cell of an island type and a word line, the stacked structure positioned over the channel region wherein the stacked structure overlies and engages the channel region and overlies and engages portions of the S/D regions or overlies and engages only the channel region;
    a reference voltage line in contact with the source junction region; and a bit line in contact with the drain junction region.

5. The MRAM according to claim 4, wherein the gate oxide N film has a thickness of less than 30 Å.

6. The MRAM according to claim 4, wherein the MTJ cell comprises a stacked structure having a free ferromagnetic layer, a tunnel barrier layer and a pinned ferromagnetic layer.

7. The MRAM according to claim 4, wherein the bit line is in contact with the drain junction region via a connection line and a bit line contact plug.

8. The MRAM according to claim 4, wherein an insulating film spacer is formed at side walls of the word line.

* * * * *

UNITED STATES PATENT AND TRADEMARK OFFICE
CERTIFICATE OF CORRECTION

PATENT NO. : 6,664,579 B2 Page 1 of 1
DATED : December 16, 2003
INVENTOR(S) : Chang Shuk Kim et al.

It is certified that error appears in the above-identified patent and that said Letters Patent is hereby corrected as shown below:

Column 8,
Line 52, please delete "oxide N film" and replace with -- oxide film --.

Signed and Sealed this

Twenty-second Day of June, 2004

JON W. DUDAS
*Acting Director of the United States Patent and Trademark Office*